(12) United States Patent
Shin (10) Patent No.: US 9,831,891 B2
(45) Date of Patent: Nov. 28, 2017

(54) COUNTER, ANALOGUE TO DIGITAL CONVERTER INCLUDING THE COUNTER AND IMAGE SENSING DEVICE INCLUDING THE ANALOGUE TO DIGITAL CONVERTER

(71) Applicant: SK hynix Inc., Gyeonggi-do (KR)

(72) Inventor: Min-Seok Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 314 days.

(21) Appl. No.: 14/490,440

(22) Filed: Sep. 18, 2014

(65) Prior Publication Data

US 2015/0326242 A1 Nov. 12, 2015

(30) Foreign Application Priority Data

May 7, 2014 (KR) ........................ 10-2014-0054338

(51) Int. Cl.
| | |
|---|---|
| H03M 1/12 | (2006.01) |
| H03M 1/56 | (2006.01) |
| H03M 1/36 | (2006.01) |
| H03K 21/10 | (2006.01) |
| H03K 19/21 | (2006.01) |
| G11C 27/02 | (2006.01) |
| H03K 4/02 | (2006.01) |
| H04N 5/378 | (2011.01) |
| H04N 5/376 | (2011.01) |

(52) U.S. Cl.
CPC .............. *H03M 1/56* (2013.01); *G11C 27/02* (2013.01); *H03K 4/02* (2013.01); *H03K 19/21* (2013.01); *H03K 21/10* (2013.01); *H03M 1/1245* (2013.01); *H03M 1/36* (2013.01); *H04N 5/376* (2013.01); *H04N 5/378* (2013.01); *H03M 1/123* (2013.01)

(58) Field of Classification Search
CPC ........ H03M 1/56; H03M 1/1245; H03M 1/36; H03M 1/123; H03K 21/10; H03K 19/21; H03K 4/02; G11C 27/02; H04N 5/376; H04N 5/378
USPC .................................................. 341/155, 164
See application file for complete search history.

(56) References Cited

U.S. PATENT DOCUMENTS

| | | | | |
|---|---|---|---|---|
| 7,471,231 | B2 * | 12/2008 | Ang ..................... | H03M 1/0682 341/155 |
| 7,554,479 | B2 | 6/2009 | Lim | |
| 8,115,842 | B2 * | 2/2012 | Lebouleux ........... | H04N 5/3658 341/155 |
| 8,395,539 | B2 | 3/2013 | Lim et al. | |
| 8,482,448 | B2 * | 7/2013 | Burm ...................... | H03K 4/06 341/166 |
| 8,659,465 | B2 * | 2/2014 | Simony ................... | H03M 1/58 341/169 |

(Continued)

*Primary Examiner* — Brian Young
(74) *Attorney, Agent, or Firm* — IP & T GROUP LLP (57) ABSTRACT

A counter includes a sampling unit suitable for sampling a logic state of a least significant bit (LSB) during a counting hold section, the counting hold section is present between first and second ramp sections; and a toggling control unit suitable for, in response to a clock and a sampling signal outputted from the sampling unit, generating the LSB according to a first voltage level of a counting target signal during a second part of the first ramp section and generating the LSB according to a second voltage level of the counting target signal during a first part of the second ramp section.

34 Claims, 4 Drawing Sheets

(56) References Cited

U.S. PATENT DOCUMENTS

| | | | |
|---|---|---|---|
| 9,135,963 B2* | 9/2015 | Jung | G11C 7/06 |
| 9,438,866 B2* | 9/2016 | Solhusvik | H04N 9/045 |
| 9,450,596 B2* | 9/2016 | Kim | H04N 5/378 |
| 9,473,166 B2* | 10/2016 | Kim | H03M 3/462 |

* cited by examiner

COUNTER, ANALOGUE TO DIGITAL CONVERTER INCLUDING THE COUNTER AND IMAGE SENSING DEVICE INCLUDING THE ANALOGUE TO DIGITAL CONVERTER

CROSS-REFERENCE TO RELATED APPLICATIONS

The present application claims priority of Korean Patent Application No. 10-2014-0054338, filed on May 7, 2014, which is herein incorporated by reference in its entirety.

BACKGROUND

1. Field

Various exemplary embodiments relate to semiconductor design technology and more particularly to a counter, an analogue to digital converter including the counter, and an image sensing device including the analogue to digital converter.

2. Description of the Related Art

An image sensor captures an image using characteristics of a semiconductor that are responsive to incident light. Image sensors are categorized as charge coupled device (CCD) type and CMOS image sensor (CIS) type. Recently, the CIS-type image sensor has prevailed due to advantages of direct integrating analogue and digital control circuits into single integrated circuit (IC).

SUMMARY

Various exemplary embodiments are directed to a counter capable of alternately counting a front part and a rear part of a ramp section during an accumulative counting operation, an analogue to digital converter including the counter and an image sensing device including the analogue to digital converter.

Further, various exemplary embodiments are directed to a counter capable of clock gating, an analogue to digital converter including the counter, and an image sensing device including the analogue to digital converter.

In an exemplary embodiment, a counter may include: a sampling unit suitable for sampling a logic state of a least significant bit (LSB) during a counting hold section, the counting hold section is present between first and second ramp sections; and a toggling control unit suitable for, in response to a clock and a sampling signal outputted from the sampling unit, generating the LSB according to a first voltage level of a counting target signal during a second part of the first ramp section and generating the LSB according to a second voltage level of the counting target signal during a first part of the second ramp section.

In an exemplary embodiment, an analogue to digital converter may include: a detector suitable for detecting first and second voltage levels of a counting target signal during first and second ramp sections, respectively, on the basis of a ramp voltage; and a counter suitable for performing an accumulative counting operation in response to a detection signal outputted from the detector, wherein the counter counts a second part of the first ramp section with reference to the first voltage level of the counting target signal and a first part of the second ramp section with reference to the second voltage level of the counting target signal.

In an exemplary embodiment, an image sensing device may include: a pixel array including a plurality of pixels arranged in row and column directions; and a readout circuit portion suitable for converting a pixel signal outputted from the pixel array into a digital signal, wherein the readout circuit portion generates the digital signal by using first and second information of the pixel signal, and wherein, the first information corresponds to a second part of a first ramp section with reference to a first voltage level of the pixel signal, and the second information corresponds to a first part of a second ramp section with reference to a second voltage level of the pixel signal.

In accordance with the above exemplary embodiments, efficiency of counting operation of the counter, the analogue to digital converter including the counter, and the image sensing device including the analogue to digital converter may be improved by selectively counting one of a front part and a rear part of each ramp section during an accumulative counting operation.

Further, in accordance with the above exemplary embodiments, the counter, the analogue to digital converter including the counter, and the image sensing device including the analogue to digital converter may reduce current consumption because of clock gating.

DETAILED DESCRIPTION

Various embodiments will be described below in more detail with reference to the accompanying drawings. The embodiments may, however, be modified in different forms and should not be construed limitative. The drawings are not necessarily to scale and, in some instances, proportions may have been exaggerated in order to clearly illustrate features of the embodiments. Throughout the disclosure, the same reference numerals correspond directly to like parts. It is also noted that in this specification, "connected/coupled" refers to a component not only directly coupled to another component but also indirectly coupled to another component through an intermediate component. In addition, a singular form may include a plural form as long as it is not specifically mentioned. It should be readily understood that the meaning of "on" and "over" should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
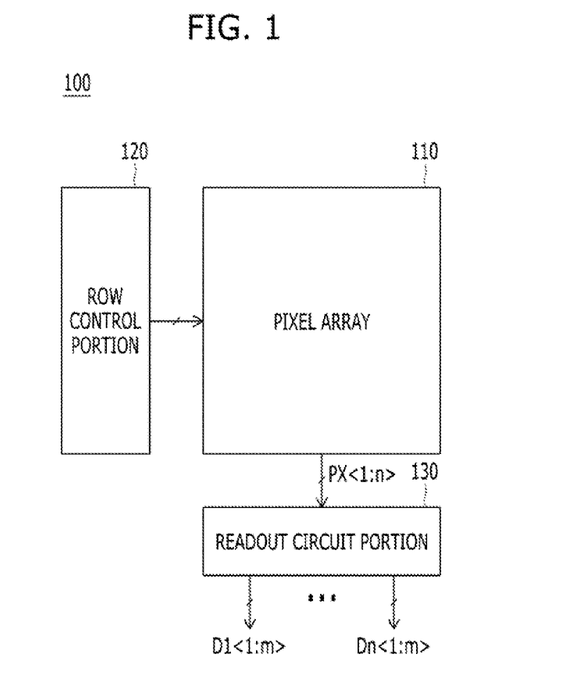
FIG. 1 is a block diagram illustrating an image sensing device in accordance with an exemplary embodiment.

FIG. 1 is a block diagram illustrating an image sensing device 100 in accordance with an exemplary embodiment.

Referring to FIG. 1, the image sensing device 100 may include a pixel array 110, a row control portion 120, and a readout circuit portion 130.

The pixel array 110 may include a plurality of pixels arranged in both row and column directions. The row control portion 120 may control the pixel array 110 row by row.

The readout circuit portion 130 may convert pixel signals PX<1:n>, which are sequentially outputted from the pixel array 110, into digital signals D1<1:m> to Dm<1:m>. The readout circuit portion 130 may generate the digital signals D1<1:m> to Dm<1:m> corresponding to the pixel signals PX<1:n> respectively, by alternately using one of first and second information according to the output sequence of each of the pixel signals PX<1:n>. With reference to each voltage level of the sequentially outputted pixel signals PX<1:n>, the first information may correspond to a first part (e.g., a front part) of each of the ramp sections, and the second information may correspond to a second part (e.g., a rear part) of each of the ramp sections, or vice versa.

Each of the pixel signals PX<1:n> may include a reset signal and data signal, which are sequentially outputted through corresponding pixel. Also, each of the pixel signals PX<1:n> may include two or more reset signals, and two or more data signals, which are sequentially outputted through two or more pixels in a binning mode.

The pixel array 110 and the row control portion 120 will not be described in detail. The readout circuit portion 130 will be described in detail.

Figure 2:
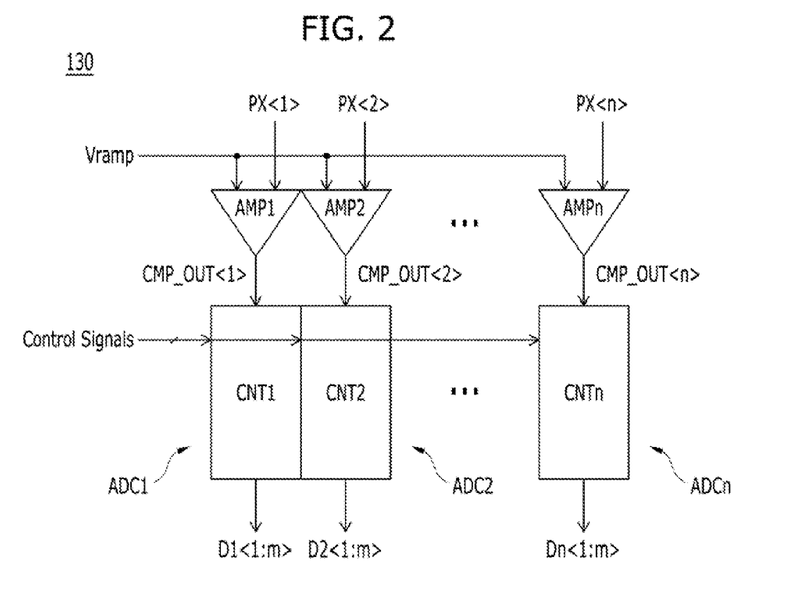
FIG. 2 is a block diagram illustrating an example of a readout circuit portion shown in FIG. 1.
Figure 3:
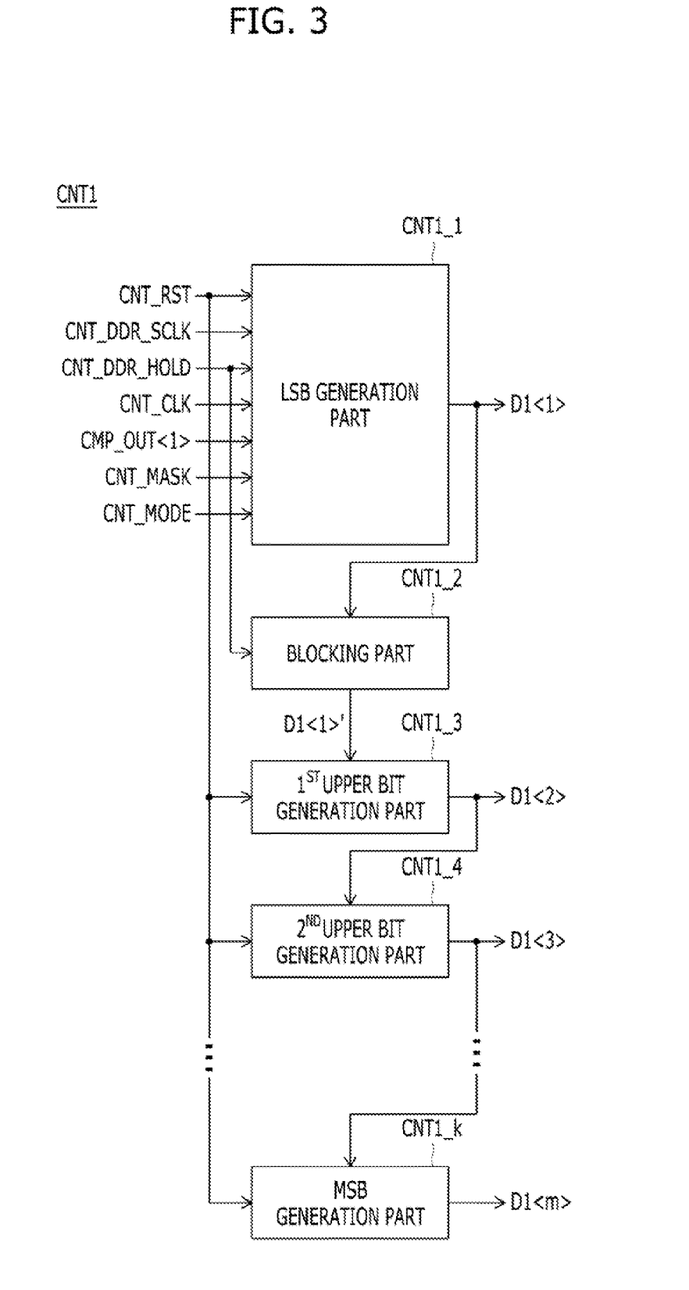
FIG. 3 is a block diagram illustrating an example of a first counter shown in FIG. 2.
Figure 4:
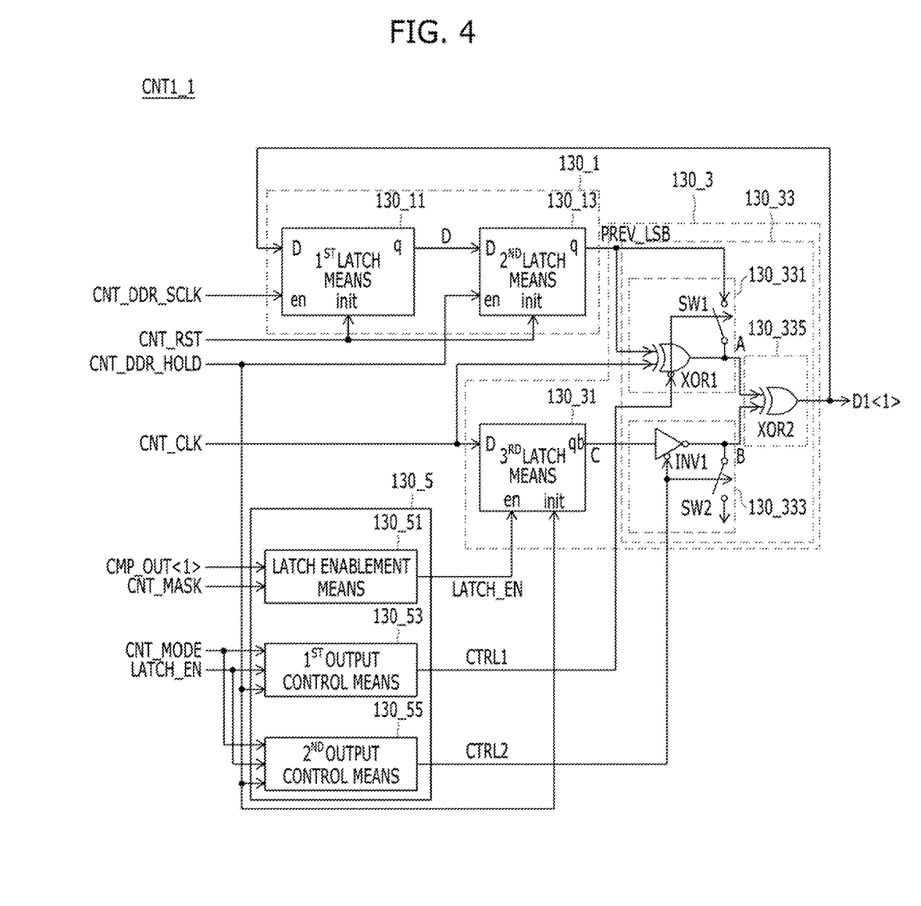
FIG. 4 is a circuit diagram illustrating an example of LSB generation part shown in FIG. 3.

FIG. 2 is a block diagram illustrating an example of the readout circuit portion 130 shown in FIG. 1. FIG. 3 is a block diagram illustrating an example of a first counter CNT1 shown in FIG. 2. FIG. 4 is a circuit diagram illustrating an example of LSB generation part CNT1_1 shown in FIG. 3.

Referring to FIG. 2, the readout circuit portion 130 may include a plurality of analogue to digital converters ADC1 to ADCn. The plurality of analogue to digital converters ADC1 to ADCn may be configured to process multiple pixel signals PX<1:n>. The plurality of analogue to digital converters ADC1 to ADCn may convert each of the pixel signals PX<1:n> into each of the digital signals D1<1:m> to Dm<1:m>. The plurality of analogue to digital converters ADC1 to ADCn may be the same in structure. The first analogue to digital converter ADC1 will be described n detail below.

The first analogue to digital converter ADC1 may include a first detector AMP1, and a first counter CNT1. The first detector AMP1 may detect a voltage level of a first pixel signal PX<1> which may be sequentially inputted during each of the ramp sections, on the basis of a ramp voltage Vramp ramping during each of the ramp sections. The first counter CNT1 may perform an accumulative counting operation in response to a first detection signal CMP_OUT<1> outputted from the first detector AMP1. The first counter CNT1 may selectively count one of the front and rear parts of each of the ramp sections with reference to the voltage level of the first pixel signal PX<1> according to the input sequence of the first pixel signal PX<1>.

The first detector AMP1 may include a comparator capable of comparing voltage levels of the ramp voltage Vramp and the first pixel signal PX<1>. The comparator is a well-known unit.

Referring to FIG. 3, the first counter CNT1 may include a least significant bit (LSB) generation part. CNT1_1, a blocking part CNT1_2, and a plurality of upper significant bit generation parts CNT1_3 to CNT1_$k$. The LSB generation part CNT1_1 may generate a LSB signal D1<1> in response to the first detection signal CMP_OUT<1> and various control signals CNT_RST, CNT_DDR_SCLK, CNT_DDR_HOLD, CNT_CLK, CNT_MASK, and CNT_MODE. The blocking part CNT1_2 may block the LSB signal D1<1> during a counting hold section present between the ramp sections. The plurality of upper significant bit generation parts CNT1_3 to CNT1_$k$ may generate upper significant bits D1<2> to D1<m> including a most significant bit (MSB) D1<m> in response to the LSB signal D1<1>' outputted from the blocking part CNT1_2.

Referring to FIG. 4, the LSB generation part CNT1_1 may include a sampling unit 130_1, a toggling control unit 130_3, and a control logic unit 130_5. The sampling unit 130_1 may sample a logic state of the LSB signal D1<1> during the counting hold section. The toggling control unit 130_3 may generate the LSB signal D1<1>, which toggles according to the voltage level of the first pixel signal PX<1> during each of the ramp sections, in response to a clock CNT_CLK and a sampling signal PREV_LSB outputted from the sampling unit 130_1. The toggling control unit 130_3 may generate the LSB signal D1<1>, which toggles during the first part (e.g., front part) of odd and even ramp sections with reference to the voltage level of the first pixel signal PX<1>. Likewise, the toggling control unit 130_3 may generate the LSB signal D1<1> which toggles during the second part (e.g., rear part) of the odd and even ramp sections with reference to the voltage level of the first pixel signal PX<1>. The control logic unit 130_5 may control so that the toggling control unit 130_3 alternately selects the front or rear part of each of the odd and even ramp sections.

The sampling unit 130_1 may include a first latch means 130_11, and a second latch means 130_13. The first latch means 130_11 may latch the LSB signal D1<1> during the counting hold section in response to a latch control signal CNT_DDR_SCLK. The second latch means 130_13 may latch a LSB latch signal D, which is latched by the first latch means 130_11, as the sampling signal PREV_LSB during the counting hold section in response to a counting hold signal CNT_DDR_HOLD.

The toggling control unit 130_3 may include a third latch means 130_31 and an LSB output means 130_33. For example, the third latch means 130_31 may invert a clock CNT_CLK and output a Inverted clock during the first part (e.g., the front part) of each of the ramp sections, and may sample a logic state of the clock CNT_CLK during the second part (e.g., the rear part) of each of the ramp sections in response to a latch enable signal LATCH_EN, The LSB output means 130_33 may output the LSB signal D1<1>, which alternately toggles during the front and rear parts of each of the even and odd ramp sections, in response to first and second output control signals CTRL1, and CTRL2, the clock CNT_CLK, the sampling signal PREV_LSB, and a latch signal C outputted from the third latch means 130_31.

The third latch means 130_31 may invert the clock CNT_CLK when the latch enable signal LATCH_EN is activated, and may output the inverted clock as the latch signal C. The third latch means 130_31 may output the latch signal C fixed with a logic level which is contrary to the logic level of the clock CNT_CLK corresponding to the moment of deactivation of the latch enable signal LATCH_EN when the latch enable signal LATCH_EN is deactivated.

The LSB output means 130_33 may include a first toggling signal generation unit 130_331, a second toggling signal generation unit 130_333, and an output unit 130_335. The first toggling signal generation unit 130_331 may generate a first toggling signal A during the second part (e.g., the rear part) of the odd ramp sections, in response to the first control signal CTRL1, the sampling signal PREV_LSB, and the clock CNT_CLK. The second toggling signal generation unit 130_333 may generate a second toggling signal B during the first part (e.g., the front part) of the even ramp section, in response to the second control signal CTRL2 and the latch signal C. The output unit 130_335 may output the LSB signal D1<1> in response to the first and second toggling signals A and B.

The first toggling signal generation unit 130_331 may output the clock CNT_CLK as the first toggling signal A when the sampling signal PREV_LSB has a logic low level, and may output the inversion of the clock CNT_CLK as the first toggling signal A when the sampling signal PREV_LSB has a high level. For example, the first toggling signal generation unit 130_331 may include a first switch SW1 and a first XOR gate XOR1. The first switch SW1 may operate in response to the first control signal CTRL1, and may output the sampling signal PREV_LSB as the first toggling signal A during the counting hold section and each of the even ramp sections. The first XOR gate XOR1 may be activated in response to the inversion of the first output control signal CTRL1, and may output the first toggling signal A by performing an XOR operation to the sampling signal PREV_LSB and the clock CNT_CLK during each of the odd ramp sections.

The second toggling signal generation unit 130_333 may generate a fixed logic level as the second toggling signal B according to a logic state of the clock CNT_CLK during the front and rear parts of the odd ramp section, and may generate a ground voltage VSS as the second toggling signal B during the counting hold section. For example, the second toggling signal generation unit 130_333 may include a second switch SW2 and a first inverter INV1. The second switch SW2 may operate in response to the second control signal CTRL2, and may output the ground voltage VSS as the second toggling signal B during the counting hold section. The first inverter INV1 may be activated in response to the inversion of the second output control signal CTRL2, and may output an inversion of the latch signal C as the second toggling signal B during the first part (e.g., the front part) of the even ramp section.

The output unit 130_335 may output one of the first and second toggling signals A and B as the LSB signal D1<1> during each of the odd ramp sections, and may output the other one of the first and second toggling signals A and B as the LSB signal D1<1> during each of the even ramp sections. For example, the output unit 130_335 may include a second XOR gate XOR2 for outputting the LSB signal D1<1> by performing an XOR operation to the first and second toggling signals A and B.

The control logic unit 130_5 may include a latch enablement means 130_51, a first output control means 130_53 and a second output control means 130_55. The latch enablement means 130_51 may generate the latch enable signal LATCH_EN in response to the first detection signal CMP_OUT<1> and a counting mask signal CNT_MASK activating each of the ramp sections. The first output control means 130_53 may generate the first output control signal CTRL1 in response to a ramp section identification signal CNT_MODE for identifying the odd ramp section and the even ramp section the latch enable signal LATCH_EN, and the counting hold signal CNT_DDR_HOLD. The second output control means 130_55 may generate the second output control signal CTRL2 in response to the ramp section identification signal CNT_MODE, the latch enable signal LATCH_EN and the counting hold signal CNT_D-DR_HOLD.

The latch enablement means 130_51 may generate the latch enable signal LATCH_EN, In an embodiment, the latch enable signal LATCH_EN is activated during the first part (e.g., the front part) of each of the ramp sections, and is activated during activation of the counting hold signal CNT_DDR_HOLD.

The first output control means 130_53 may generate the first output control signal CTRL1, which is activated during part or all of the ramp sections, and during part or all of the counting hold section. For example, the first output control means 130_53 may short the first switch SW1 by activating the first output control signal CTRL1 during the front part of the odd ramp section, part or all of the counting hold section, and the even ramp section. The first XOR gate XOR1 may be deactivated by the inversion of the first output control signal CTRL1 because the inversion of the first output control signal CTRL1 is inputted to the first XOR gate XOR1. Therefore, it is possible to clock-gate because the first XOR gate XOR1 does not perform toggling operation when deactivated. On the other hand, the first output control means 130_53 may activate the first XOR gate XOR1 by disabling the first output control signal CTRL1 during remaining sections other than the front part of the odd ramp section, part or all of the counting hold section, and the even ramp section. The first XOR gate XOR1 may be activated by the inversion of the first output control signal CTRL1 during the remaining sections other than the front part of the odd ramp section, part or all of the counting hold section, and the even ramp section because the inversion of the first output control signal CTRL1 is inputted to the first XOR gate XOR1.

The second output control means 130_55 may generate the second output control signal CTRL2, which is activated during part of each of the ramp sections, and during part of the counting hold section. For example, the second output control means 130_55 may short the second switch SW2 by activating the second output control signal CTRL2 during the front part of the odd ramp section, and part of the counting hold section. The first inverter INV1 may be deactivated by the inversion of the second output control signal CTRL2 because the inversion of the second output control signal CTRL2 is inputted to the first inverter INV1. Therefore, it is possible to clock-gate because the first inverter INV1 does not perform toggling operation when deactivated. On the other hand, the second output control means 130_55 may activate the first inverter INV1 by disabling the second output control signal CTRL2 during remaining sections other than the front part of the odd ramp section, and part of the counting hold section. The first inverter INV1 may be activated by the inversion of the second output control signal CTRL2 during the remaining sections other than the front part of the odd ramp section, and part of the counting hold section because the inversion of the second output control signal CTRL2 is inputted to the first inverter INV1.

Referring back to FIG. 3, the blocking part CNT1_2 may block transfer of a glitch to the first upper significant bit generation part CNT1_3 even though the glitch occurs in the LSB signal D1<1> during the counting hold section.

Also, each of the plurality of upper significant bit generation parts CNT1_3 to CNT1_*k* may include a T flip-flop.

Operation of the mage sensing device 100 in accordance with an exemplary embodiment will be described with reference to FIG. 5.

Figure 5:
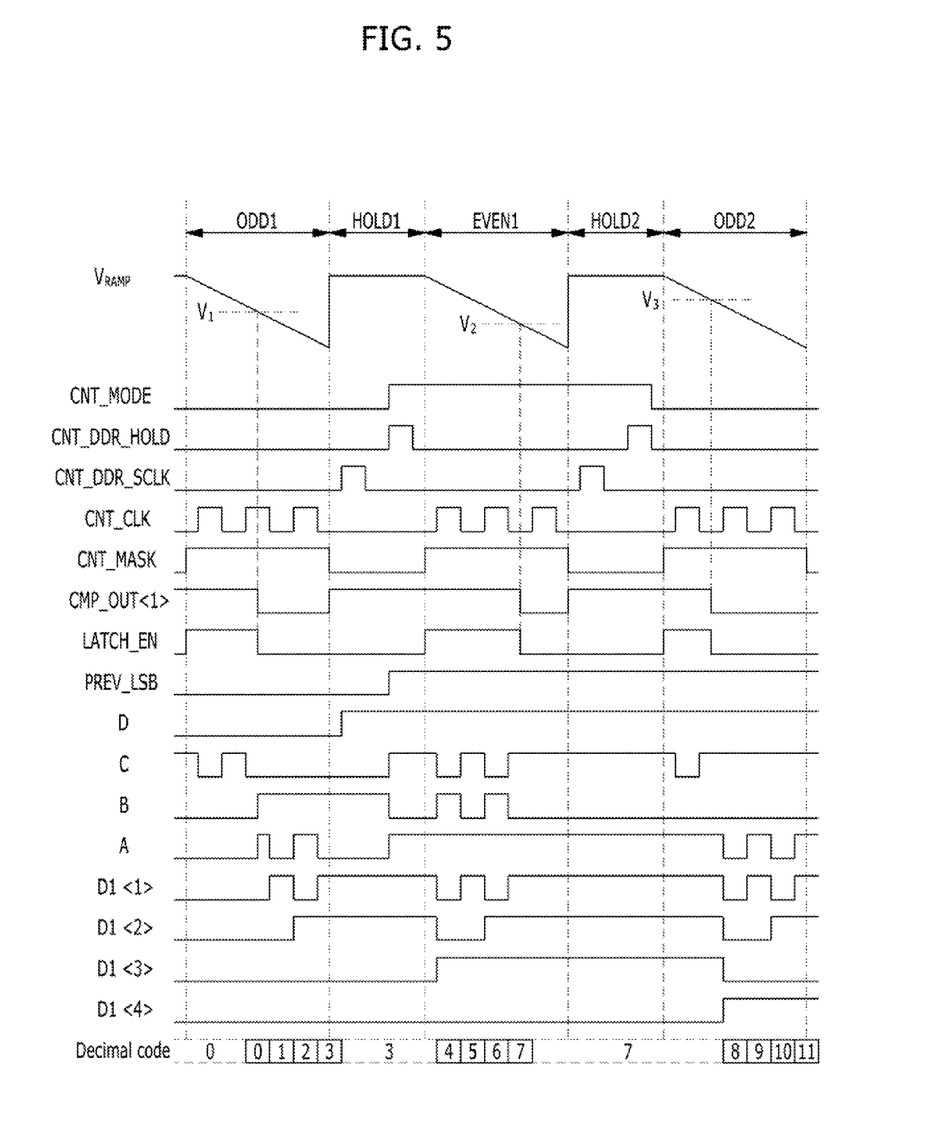
FIG. 5 is a timing diagram illustrating operation of an image sensing device in accordance with an exemplary embodiment.

FIG. 5 is a timing diagram illustrating operation of the image sensing device 100 in accordance with an exemplary embodiment.

For an exemplary purpose, FIG. 5 describes the situation when the counting operation is performed during the rear part of the odd ramp section and the front part of the even ramp section.

Also, for an exemplary purpose, FIG. 5 describes a p corresponding to the first pixel signal PX<1>.

Referring to FIG. 5, the image sensing device 100 may perform the accumulative counting operation for a first odd ramp section ODD1, a first counting hold section HOLD1, a first even ramp section EVEN1, a second counting hold section HOLD2, and a second odd ramp section ODD2. The image sensing device 100 may detect the voltage level of the first pixel signal PX<1>, and perform the accumulative counting operation based on the detection result obtained during each of the first odd ramp section ODD1, the first even ramp section EVEN1, and the second odd ramp section ODD2. Operations during each of the sections will be described.

The First Odd Ramp Section ODD1

The first odd ramp section ODD1 may be divided into the front part and the rear part with reference to the voltage level V1 of the first pixel signal PX<1>. For example, the first odd ramp section ODD1 may be divided into the front part and the rear part according to the logic state of the first detection signal CMP_OUT<1> transitioning when the ramp voltage Vramp becomes lower than the voltage level V1 of the first pixel signal PX<1>.

The latch enable signal LATCH_EN may be activated during the front part of the first odd ramp section ODD1. Then, the third latch means 130_31 may invert the clock CNT_CLK and output the inverted clock as the latch signal C during the front part of the first odd ramp section ODD1. Also, the first and second output control signals CTRL1 and CTRL2 may be activated during the front part of the first odd ramp section DD1. Accordingly, the first switch SW1 may output the sampling signal PREV_LSB as the first toggling signal A, and the second switch SW2 may output the ground voltage VSS as the second toggling signal B. At this time, the first XOR gate XOR1 and the first inverter INV1 may be deactivated by the inversion of the first and second output control signals CTRL1 and CTRL2.

The latch enable signal LATCH_EN may be deactivated during the rear part of the first odd ramp section ODD1. Then, the third latch means 130_31 may sample the logic state of the clock CNT_CLK at the time of deactivation of the latch enable signal LATCH_EN, and may output the latch signal C. The latch signal C is an inversion of the clock CNT_CLK. Thus, the latch signal C has a logic level opposite to the logic level which the clock CNT_CLK has at the time of deactivation of the latch enable signal LATCH_EN. For example, the clock CNT_CLK may have a logic high level at the time of deactivation of the latch enable signal LATCH_EN, and the third latch means 130_31 may output a signal with a logic low level as the latch signal C. Also, the first and second output control signals CTRL1 and CTRL2 may be deactivated during the rear part of the first odd ramp section ODD1. For example, the inversion of the first and second output control signal CTRL1 and CTRL2 may be activated during the rear part of the first odd ramp section ODD1. Accordingly, the first XOR gate XOR1 may be activated, and output the non-inverted clock CNT_CLK as the first toggling signal A during the rear part of the first odd ramp section ODD1. Also, the first inverter INV1 may be activated, invert the latch signal C, and output the inversion of the latch signal C as the second toggling signal B during the rear part of the first odd ramp section ODD1.

The second XOR gate XOR2 may invert the first toggling signal A, and output the inversion of the first toggling signal A as the LSB signal D1<1> during the rear part of the first odd ramp section ODD1.

The First Counting Hold Section HOLD1

The latch control signal CNT_DDR_SCLK and the counting hold signal CNT_DDR_HOLD may be sequentially activated during the first counting hold section HOLD1. The first latch means 130_11 may latch the LSB signal D1<1> when the latch control signal CNT_DDR_SCLK is activated. For example, the first latch means 130_11 may latch the LSB signal D1<1> having a logic high level, and output the LSB latch signal D having a logic high level. At this time, the first and second output control signals CTRL1 and CTRL2 may stay deactivated. Then, when the counting hold signal CNT_DDR_HOLD is activated, the second latch means 130_13 may latch the LSB latch signal D as the sampling signal PREV_LSB. For example, when the counting hold signal CNT_DDR_HOLD is activated, the second latch means 130_13 may latch the LSB latch signal D having a logic high level, and output a logic high signal as the sampling signal PREV_LSB. At this time, the first and second output control signals CTRL1 and CTRL2 may be activated. Accordingly, the first switch SW1 may output the sampling signal PREV_LSB having a logic high level as the first toggling signal A, and the second switch SW2 may output the ground voltage HISS as the second toggling signal B. The third latch means 130_31 may be initialized in response to the counting hold signal CNT_DDR_HOLD. For example, the third latch means 130_31 may output the latch signal C having a logic high level according to the initialization process.

The First Even Ramp Section EVEN1

The first even ramp section EVEN1 may be divided into the first part (e.g., the front part) and the second part (e.g., the rear part) with reference to the voltage level V2 of the first pixel signal PX<1>. For example, the first even ramp section EVEN1 may be divided into the front part and the rear part according to the logic state of the first detection signal CMP_OUT<1>. The logic state of the first detection signal CMP_OUT<1> changes when the ramp voltage Vramp becomes lower than the voltage level V2 of the first pixel signal PX<1>.

The latch enable signal LATCH_EN may be activated during the front part of the first even ramp section EVEN1. Then, the third latch means 130_31 may invert the clock CNT_CLK and output the inverted clock CNT_CLK as the latch signal C during the front part of the first even ramp section EVEN1. Also, the first output control signal CTRL1 may be activated, and the second output control signal CTRL2 may be deactivated during the front part of the first even ramp section EVEN1. Accordingly, the first switch SW1 may output the sampling signal PREV_LSB as the first toggling signal A, and the first inverter INV1 may invert the latch signal C, and output the inversion of the latch signal C as the second toggling signal B. At this time, the first XOR gate XOR1 may be deactivated, and the second switch S2 may be open.

The latch enable signal LATCH_EN may be deactivated during the rear part of the first even ramp section EVEN1. Then, the third latch means 130_31 may sample the logic state of the clock CNT_CLK at the time of deactivation of the latch enable signal LATCH_EN, and may output the latch signal C, which has a logic level opposite to the logic level that the clock CNT_CLK has at the time of deactivation of the latch enable signal LATCH_EN. For example, the clock CNT_CLK may have a logic low level at the time of deactivation of the latch enable signal LATCH_EN, and the third latch means 130_31 may output the latch signal C with a logic high level. Also, the first output control signal CTRL1 may be activated, and the second output control signal CTRL2 may be deactivated during the rear part of the first even ramp section EVEN1. Accordingly, the first switch SW1 may output the sampling signal PREV_LSB as the first toggling signal A during the rear part of the first even ramp section EVEN1. Also, the first inverter INV1 may invert the latch signal C, and output the inversion of the latch signal C as the second toggling signal B during the rear part of the first even ramp section EVEN1. At this time, the first. XOR gate XOR1 may be deactivated, and the second switch. SW2 may be open.

The second XOR gate XOR2 may invert the second toggling signal B, and output the inversion of the second toggling signal B as the LSB signal D1<1> during the front part of the first even ramp section EVEN1.

The Second Counting Hold Section HOLD2

The latch control signal CNT_DDR_SCLK and the counting hold signal CNT_DDR_HOLD may be sequentially activated during the second counting hold section HOLD2. The first latch means 130_11 may latch the LSB signal D1<1> when the latch control signal CNT_D-DR_SCLK is activated. For example, the first latch means 130_11 may latch the LSB signal D1<1> having a logic high level, and output the LSB latch signal D having a logic high level. At this time, the first output control signal CTRL1 may stay activated, and the second output control signal CTRL2 may stay deactivated. Then, when the counting hold signal CNT_DDR_HOLD is activated, the second latch means 130_13 may latch the LSB latch signal D as the sampling signal PREV_LSB. For example, when the counting hold signal CNT_DDR_HOLD is activated, the second latch means 130_13 may latch the LSB latch signal D having a logic high level, and output the sampling signal PREV_LSB having a logic high level. At this time, the first and second output control signals CTRL1 and CTRL2 may be activated. Accordingly, the first switch SW1 may output the sampling signal PREV_LSB having a logic high level as the first toggling signal A, and the second switch SW2 may output the ground voltage VSS as the second toggling signal B. The third latch means 130_31 may be initialized in response to the counting hold signal CNT_DDR_HOLD. For example, the third latch means 130_31 may output the latch signal C having a logic high level according to the initialization process.

The Second Odd Ramp Section ODD2

Operation during the second odd ramp section ODD2 may be the same as the first odd ramp section ODD1.

As described above, in accordance with various exemplary embodiments, a counter, an analogue to digital converter including the counter, and an image sensing device including the analogue to digital converter may alternately count a front part and a rear part of each ramp section during an accumulative counting operation, as well as perform clock gating.

It should be noted that various embodiments have been described for illustrative purposes and should not be construed as limitative.

For example, embodiments are not limited to the example of alternately counting a front part and a rear part of each ramp section, and, in another embodiment, front parts and rear parts of a group including two or more the ramp sections may be alternately counted.

Also, embodiments are not limited to the accumulative counting operation using a single-slope ramp voltage. The embodiments may be applied to a system for multiple sampling, digital binning, and so forth.

What is claimed is:

1. A counter comprising:
   a sampling unit suitable for sampling a logic state of a least significant bit (LSB) during a counting hold section, the counting hold section is present between first and second ramp sections; and
   a toggling control unit suitable for, in response to a clock and a sampling signal outputted from the sampling unit, generating the LSB according to a first voltage level of a counting target signal during a second part of the first ramp section and generating the LSB according to a second voltage level of the counting target signal during a first part of the second ramp section.

2. The counter of claim 1, wherein the second part is one of front and rear parts of the first ramp section with reference to the first voltage level of the counting target signal, and the first part is one of front and rear parts of the second ramp section with reference to the second voltage level of the counting target signal.

3. The counter of claim 1, wherein the sampling unit comprises:
   a first latch means suitable for latching the LSB during the counting hold section; and
   a second latch means suitable for latching the LSB latched by the first latch means as the sampling signal.

4. The counter of claim 1, wherein the toggling control unit comprises:
   a third latch means suitable for inverting the clock and outputting the inverted clock during the second part of the first ramp section and the first part of the second ramp section, and suitable for sampling a logic state of the clock during a first part of the first ramp section and a second part of the second ramp section, in response to a latch enable signal; and
   an LSB output means suitable for outputting the LSB in response to signals including first and second output control signals, the clock, the sampling signal, and a latch signal outputted from the third latch means.

5. The counter of claim 4, wherein the LSB output means comprises:
   a first toggling signal generation unit suitable for generating a first toggling signal, which toggles during the second part of the first ramp section in response to the first control signal, the sampling signal, and the clock;
   a second toggling signal generation unit suitable for generating a second toggling signal, which toggles during the first part of the second ramp section in response to the second control signal, and the latch signal; and
   an output unit suitable for outputting the LSB in response to the first and the second toggling signals.

6. The counter of claim 5, wherein the first toggling signal generation unit comprises:
   a first switch suitable for operating in response to the first control signal, and outputting the sampling signal as the first toggling signal during the counting hold section and the second ramp section; and
   a first logic operator activated in response to an inversion of the first output control signal and suitable for outputting a signal obtained by performing an XOR operation to the sampling signal and the clock as the first toggling signal during the first ramp section.

7. The counter of claim 5, wherein the first toggling signal generation unit outputs the clock as the first toggling signal when the sampling signal has a logic low level, and outputs an inversion of the clock as the first toggling signal when the sampling signal has a high level.

8. The counter of claim 5, wherein the second toggling signal generation unit comprises:
  a second switch suitable for operating in response to the second control signal, and outputting a ground voltage as the second toggling signal during the counting hold section; and
  a second logic operator activated in response to an inversion of the second output control signal, and suitable for outputting a signal obtained by inverting the latch signal as the second toggling signal during the first and second ramp sections.

9. The counter of claim 5, wherein the second toggling signal generation unit generates a fixed logic level as the second toggling signal according to the logic state of the clock during the first ramp section, and generates a ground voltage as the second toggling signal during the counting hold section.

10. The counter of claim 5, wherein the output unit outputs the LSB by performing an XOR operation to the first and second toggling signals.

11. The counter of claim 1, further comprising:
  a blocking part suitable for blocking the LSB during the counting hold section; and
  an upper significant bit generation part suitable for generating upper significant bits including a most significant bit (MSB) in response to the LSB outputted from the blocking part.

12. An analogue to digital converter comprising:
  a detector suitable for detecting first and second voltage levels of a counting target signal during first and second ramp sections, respectively, on the basis of a ramp voltage; and
  a counter suitable for performing an accumulative counting operation in response to a detection signal outputted from the detector, wherein the counter counts a second part of the first ramp section with reference to the first voltage level of the counting target signal and a first part of the second ramp section with reference to the second voltage level of the counting target signal,
  wherein the second part is one of front and rear parts of the first ramp section with reference to the first voltage level of the counting target signal, and the first part is one of front and rear parts of the second ramp section with reference to the second voltage level of the counting target signal.

13. The analogue to digital converter of claim 12, wherein the counter comprises:
  a sampling unit suitable for sampling a logic state of a least significant bit (LSB) during a counting hold section that is present between the first and second ramp sections;
  a toggling control unit suitable for generating the LSB, which toggles during the second part of the first ramp section and the first part of the second ramp section in response to signals including a clock and a sampling signal outputted from the sampling unit; and
  a control logic unit suitable for controlling the toggling control unit to select the second part of the first ramp section and the second part of the second ramp section.

14. The analogue to digital converter of claim 13, wherein the sampling unit comprises:
  a first latch means suitable for latching the LSB during the counting hold section; and
  a second latch means suitable for latching the LSB latched by the first latch means as the sampling signal.

15. The analogue to digital converter of claim 13, wherein the toggling control unit comprises:
  a third latch means suitable for inverting the clock and outputting the inverted clock during the second part of the first ramp section and the first part of the second ramp section, and suitable for sampling a logic state of the clock during a first part of the first ramp section and a second part of the second ramp section, in response to a latch enable signal; and
  a LSB output means suitable for output the LSB in response to signals including first and second output control signals, the clock, the sampling signal, and a latch signal outputted from the third latch means.

16. The analogue to digital converter of claim 15, wherein the LSB output means comprises:
  a first toggling signal generation unit suitable for generating a first toggling signal, which toggles during the second part of the first ramp section in response to signals including the first control signal, the sampling signal, and the clock;
  a second toggling signal generation unit suitable for generating a second toggling signal, which toggles during the first part of the second ramp section in response to the second control signal and the latch signal; and
  an output unit suitable for outputting the LSB in response to the first and second toggling signals.

17. The analogue to digital converter of claim 16, wherein the first toggling signal generation unit comprises:
  a first switch suitable for operating in response to the first control signal, and outputting the sampling signal as the first toggling signal during the counting hold section and the second ramp section; and
  a first logic operator activated in response to an inversion of the first output control signal, and suitable for outputting a signal obtained by performing an XOR operation to the sampling signal and the clock as the first toggling signal during the first ramp section.

18. The analogue to digital converter of claim 17, wherein the first toggling signal generation unit outputs the clock as the first toggling signal when the sampling signal has a logic low level, and outputs an inversion of the clock as the first toggling signal when the sampling signal has a logic high level.

19. The analogue to digital converter of claim 16, wherein the second toggling signal generation unit comprises:
  a second switch suitable for operating in response to the second control signal and outputting a ground voltage as the second toggling signal during the counting hold section; and
  a second logic operator activated in response to an inversion of the second output control signal, and suitable for outputting a signal obtained by inverting the latch signal as the second toggling signal during the first and second ramp sections.

20. The analogue to digital converter of claim 16, wherein the second toggling signal generation unit generates the second toggling signal having a fixed logic level according to the logic state of the clock during the first ramp section, and generate a ground voltage as the second toggling signal during the counting hold section.

21. The analogue to digital converter of claim 16, wherein the output unit outputs a signal obtained by performing an XOR operation to the first and second toggling signals as the LSB.

22. The analogue to digital converter of claim 16, further comprising:

a blocking part suitable for blocking the LSB during the counting hold section; and an upper significant bit generation part suitable for generating upper significant bits, including a most significant bit (MSB), in response to the LSB outputted from the blocking part.

23. An image sensing device comprising:
a pixel array including a plurality of pixels arranged in row and column directions; and
a readout circuit portion suitable for converting a pixel signal outputted from the pixel array into a digital signal,
wherein the readout circuit portion generates the digital signal by using first and second information of the pixel signal, and
wherein, the first information corresponds to a second part of a first ramp section with reference to a first voltage level of the pixel signal, and the second information corresponds to a first part of a second ramp section with reference to a second voltage level of the pixel signal, and
wherein, the second part is one of front and rear parts of the first ramp section with reference to the first voltage level of the counting target signal, and the first part is one of front and rear parts of the second ramp section with reference to the second voltage level of the counting target signal.

24. The image sensing device of claim 23, wherein the readout circuit portion comprises:
a detector suitable for detecting the first and second voltage levels of the pixel signal on the basis of a ramp voltage ramping during the first and second ramp sections, respectively; and
a counter suitable for performing an accumulative counting operation according to the first and second voltage levels detected by the detector, wherein the counter sequentially counts the second part of the first ramp section and the first part of the second ramp section.

25. The image sensing device of claim 24, wherein the counter comprises:
a sampling unit suitable for sampling a logic state of a least significant bit (LSB) during a counting hold section that is present between the first and the second ramp sections;
a toggling control unit suitable for generating the LSB, which toggles during the second part of the first ramp section and the first part of the second ramp section in response to a clock and a sampling signal outputted from the sampling unit; and
a control logic unit suitable for controlling the toggling control unit to select the second part of the first ramp section and the first part of the second ramp section.

26. The image sensing device of claim 25, wherein the sampling unit comprises:
a first latch means suitable for latching the LSB during the counting hold section; and
a second latch means suitable for latching the LSB latched by the first latch means as the sampling signal.

27. The image sensing device of claim 25, wherein the toggling control unit comprises:
a third latch means suitable for inverting the clock and outputting the inverted clock during the second part of the first ramp section and the first part of the second ramp section, and suitable for sampling a logic state of the clock during a first part of the first ramp section and a second part of the second ramp section, respectively, in response to a latch enable signal; and a LSB output means suitable for output the LSB, which alternately toggles during the second part of the first ramp section and the first part of the second ramp section in response to signals including first and second output control signals, the clock, the sampling signal, and a latch signal outputted from the third latch means.

28. The image sensing device of claim 27, wherein the LSB output means comprises:
a first toggling signal generation unit suitable for generating a first toggling signal, which toggles during the second part of the first ramp section in response to signals including the first control signal, the sampling signal, and the clock;
a second toggling signal generation unit suitable for generating a second toggling signal, which toggles during the first part of the second ramp section in response to signals including the second control signal, and the latch signal; and
an output unit suitable for outputting the LSB in response to the first and second toggling signals.

29. The image sensing device of claim 28, wherein the first toggling signal generation unit comprises:
a first switch suitable for operating in response to the first control signal and outputting the sampling signal as the first toggling signal during the counting hold section and the second ramp section; and
a first logic operator activated in response to an inversion of the first output control signal and suitable for outputting a signal obtained by performing an XOR operation to the sampling signal and the clock as the first toggling signal during the first ramp section.

30. The image sensing device of claim 28, wherein the first toggling signal generation unit outputs the clock as the first toggling signal when the sampling signal has a logic low level, and outputs an inversion of the clock as the first toggling signal when the sampling signal has a logic high level.

31. The image sensing device of claim 28, wherein the second toggling signal generation unit comprises:
a second switch suitable for operating in response to the second control signal and outputting a ground voltage as the second toggling signal during the counting hold section; and
a second logic operator activated in response to an inversion of the second output control signal, and suitable for outputting an inversion of the latch signal as the second toggling signal during the first and second ramp sections.

32. The image sensing device of claim 28, wherein the second toggling signal generation unit generates a fixed logic level as the second toggling signal according to the logic state of the clock during the first ramp section, and generates a ground voltage as the second toggling signal during the counting hold section.

33. The image sensing device of claim 28, wherein the output unit outputs a signal obtained by performing an XOR operation to the first and second toggling signals as the LSB.

34. The image sensing device of claim 28, further comprising:
a blocking part suitable for blocking the LSB during the counting hold section; and
an upper significant bit generation part suitable for generating upper significant bits including a most significant bit (MSB) in response to the LSB outputted from the blocking part.

* * * * *